US010199462B2

(12) United States Patent
Yang et al.

(10) Patent No.: US 10,199,462 B2
(45) Date of Patent: Feb. 5, 2019

(54) SEMICONDUCTOR INTEGRATED CIRCUITS (ICS) EMPLOYING LOCALIZED LOW DIELECTRIC CONSTANT (LOW-K) MATERIAL IN INTER-LAYER DIELECTRIC (ILD) MATERIAL FOR IMPROVED SPEED PERFORMANCE

(71) Applicant: QUALCOMM Incorporated, San Diego, CA (US)

(72) Inventors: Haining Yang, San Diego, CA (US); Xiangdong Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/650,042

(22) Filed: Jul. 14, 2017

(65) Prior Publication Data

US 2017/0317167 A1    Nov. 2, 2017

Related U.S. Application Data (62) Division of application No. 14/743,143, filed on Jun. 18, 2015, now Pat. No. 9,773,866.

(51) Int. Cl.
*H01L 29/06* (2006.01)
*H01L 23/532* (2006.01)
(Continued)

(52) U.S. Cl.
CPC .... *H01L 29/0649* (2013.01); *H01L 21/02282* (2013.01); *H01L 21/762* (2013.01);
(Continued)

(58) Field of Classification Search
CPC H01L 29/0649; H01L 23/5226; H01L 23/528
See application file for complete search history.

(56) References Cited

U.S. PATENT DOCUMENTS 7,274,108 B2    9/2007    Wu
7,492,030 B2    2/2009    Bhattacharyya et al.
(Continued)

OTHER PUBLICATIONS

Gambino, J.P., et al., "Reliability Challenges for Advanced Copper Interconnects: Electromigration and Time-Dependent Dielectric Breakdown (TDDB)," 16th IEEE International Symposium on the Physical and Failure Analysis of Integrated Circuits, Jul. 6-10, 2009, Suzhou, Jiangsu, China, IEEE, pp. 677-684.

(Continued)

*Primary Examiner* — Tran Tran
(74) *Attorney, Agent, or Firm* — Withrow & Terranova, PLLC (57) ABSTRACT

Semiconductor integrated circuits (ICs) employing localized low dielectric constant (low-K) material in inter-layer dielectric (ILD) material for improved speed performance are disclosed. To speed up performance of selected circuits in an IC that would otherwise lower overall speed performance of the IC, low-K dielectric material is employed during IC fabrication. The low-K dielectric material is provided in selected, localized areas of ILD material in which selected circuits are disposed. In this manner, the IC will experience an overall increased speed performance during operation, because circuit components and/or circuit element interconnects of selected circuit(s) that are disposed in the low-K ILD material will experience reduced signal delay. Also, by use of low-K dielectric material in only selected, localized areas of ILD material of selected circuits, mechanical and/or thermal stability concern issues that would arise from use of low-K dielectric material in all of the ILD material in the IC are avoided.

12 Claims, 5 Drawing Sheets

(51) Int. Cl.
*H01L 21/02* (2006.01)
*H01L 21/762* (2006.01)
*H01L 21/768* (2006.01)
*H01L 23/522* (2006.01)
*H01L 23/528* (2006.01)

(52) U.S. Cl.
CPC .......... *H01L 21/768* (2013.01); *H01L 23/528* (2013.01); *H01L 23/5226* (2013.01); *H01L 23/5329* (2013.01)

(56) References Cited

U.S. PATENT DOCUMENTS

| | | | |
|---|---|---|---|
| 7,871,902 | B2 | 1/2011 | Kaltalioglu et al. |
| 7,968,450 | B2 | 6/2011 | Bhavnagarwala et al. |
| 7,969,006 | B2 * | 6/2011 | Lin .................. H01L 21/76816 257/758 |
| 8,295,056 | B2 | 10/2012 | Andry et al. |
| 2004/0092091 | A1 | 5/2004 | Yang et al. |
| 2006/0197228 | A1 | 9/2006 | Daubenspeck et al. |
| 2008/0122121 | A1 | 5/2008 | Suda et al. |
| 2014/0151879 | A1 | 6/2014 | Indyk et al. |
| 2014/0319623 | A1 | 10/2014 | Tsai et al. |
| 2015/0206835 | A1 | 7/2015 | Lamorey et al. |
| 2016/0372544 | A1 | 12/2016 | Yang et al. |

OTHER PUBLICATIONS

International Search Report and Written Opinion for PCT/US2016/033709, dated Sep. 5, 2016, 11 pages.

Odegard, C., et al., "Dielectric Integrity Test for Flip-Chip Devices with Cu/Low-K Interconnects," Proceedings of the 55th Electronic Components and Technology Conference, May 31-Jun. 3, 2005, Lake Buena Vista, Florida, IEEE, pp. 1163-1171.

Second Written Opinion for PCT/US2016/033709, dated Jun. 26, 2017, 7 pages.

International Preliminary Report on Patentability for PCT/US2016/033709, dated Sep. 15, 2017, 19 pages.

* cited by examiner

SEMICONDUCTOR INTEGRATED CIRCUITS (ICS) EMPLOYING LOCALIZED LOW DIELECTRIC CONSTANT (LOW-K) MATERIAL IN INTER-LAYER DIELECTRIC (ILD) MATERIAL FOR IMPROVED SPEED PERFORMANCE

PRIORITY APPLICATION

The present application claims priority to and is a division of U.S. patent application Ser. No. 14/743,143, filed Jun. 18, 2015 and entitled "SEMICONDUCTOR INTEGRATED CIRCUITS (ICs) EMPLOYING LOCALIZED LOW DIELECTRIC CONSTANT (LOW-K) MATERIAL IN INTER-LAYER DIELECTRIC (ILD) MATERIAL FOR IMPROVED SPEED PERFORMANCE," now U.S. Pat. No. 9,773,866, which is incorporated herein by reference in its entirety.

BACKGROUND

I. Field of the Disclosure

The technology of the disclosure relates generally to speed performance of integrated circuits (ICs), and more particularly to speed performance variations between processor cores in a central processing unit (CPU) provided in a system-on-a-chip (SoC).

II. Background

Integrated circuit (IC) computing devices have become commonplace throughout society. The increasing presence of such computing devices has accelerated in part because of the increasing functionality and versatility of such computing devices. This increase in functionality and versatility has been enabled by providing increasingly powerful processors in small packages as loosely recognized by Moore's Law. As a result, companies have been trying to increase functional integration in computing devices. Companies have also been trying to decrease package size of computing devices, especially in mobile computing devices.

In this regard, one technique to provide increased functionality in a computing device in a smaller package is by providing a system-on-a-chip (SoC). A SoC integrates a central processing unit (CPU) with other computing IC components (e.g., memory, memory controller, graphics processor, power management circuits, wireless radios, etc.) to provide the desired computing device, as opposed to providing these separate components off-chip from the CPU. Thus, while a SoC may be larger than a CPU chip, the SoC is typically smaller in size and contains much more functionality than providing a CPU in a dedicated CPU chip and the other computing components in separate chips.

Figures 1, 2:
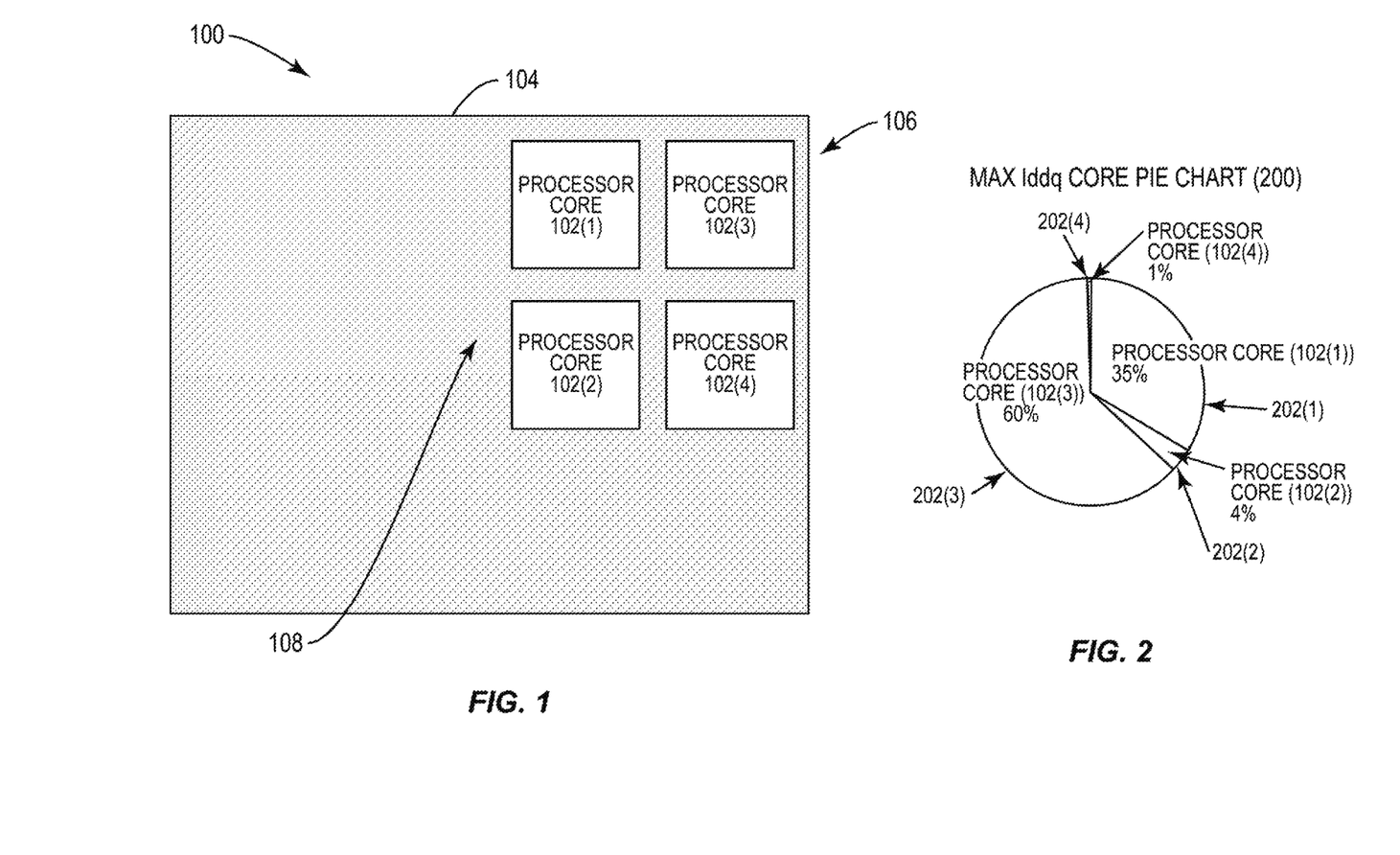
FIG. 1 is a block diagram of an exemplary system-on-a-chip (SoC) that includes a central processing unit (CPU) comprised of multiple processor cores having different speed performances due to processor core variations.
FIG. 2 is a maximum quiescent current (Iddq) pie chart illustrating exemplary core-to-core Iddq variations of the processor cores in the SoC in FIG. 1.

Multiple processor core CPUs (also referred to as "multi-core processors") are also starting to become widely adopted in SoCs to yield higher performance and for low power mobile applications. In this regard, FIG. 1 illustrates an example of a SoC 100. The SoC 100 in FIG. 1 includes four (4) processor cores 102(1)-102(4) provided in a single IC chip 104 (referred to as "chip 104"). One issue for the SoC 100 in FIG. 1 is that the processor cores 102(1)-102(4) may have different speed performances (i.e., maximum operating frequencies) even though the design of each processor core 102(1)-102(4) is the same. If core-to-core variations exist in the processor cores 102(1)-102(4) in the SoC 100 in FIG. 1, the overall chip 104 speed will be limited by the slowest processor core 102 in the SoC 100. However, the overall chip 104 leakage current will be dominated by the faster processor cores 102. Thus, if the speed performance of the faster processor cores 102 in the SoC 100 is increased beyond the speed performance of the slower processor core 102, the leakage of the SoC 100 increases without an overall speed performance benefit of the SoC 100.

In this regard, FIG. 2 is a maximum quiescent current (Iddq) pie chart 200 illustrating exemplary core-to-core Iddq variations 202(1)-202(4) of the processor cores 102(1)-102(4) in the SoC 100 in FIG. 1. Iddq testing is a known method to determine circuit process variations. Each processor core's 102(1)-102(4) Iddq variation 202(1)-202(4) in the pie chart 200 is defined as the result of the maximum Iddq minus the minimum Iddq, divided by the minimum Iddq. In this example, processor cores 102(1) and 102(3) contribute approximately 95% of the Iddq variation of the processor cores 102(1)-102(4) in the SoC 100.

Different speed performances in processor cores in a SoC may exist for several reasons. For example, the processor cores 102(1)-102(4) in the SoC 100 in FIG. 1 being located in different locations on the chip 104 can affect their relative performance speeds. As shown in FIG. 1, processor core 102(3) is located in a corner 106 of the chip 104. Processor cores 102(1), 102(4) are located near the corner 106 in the chip 104. Processor core 102(2) is located closer to a center 108 of the chip 104. Also, each processor core 102(1)-102(4) in the SoC 100 may be surrounded by different circuit blocks in the chip 104, which contribute differently to the thermal impact to each processor core 102(1)-102(4). Further, localized process variations during manufacturing of the SoC 100 could also vary threshold voltage levels (Vt) in the processor cores 102(1)-102(4) that cause variations in speed performance. Mechanical stress could also be different for each processor core 102(1)-102(4) due to location and device density.

SUMMARY OF THE DISCLOSURE

Aspects of the disclosure involve semiconductor integrated circuits (ICs) employing localized low dielectric constant (low-K) material in inter-layer dielectric (ILD) material for improved speed performance. Related devices, methods, memory systems are also disclosed. In certain aspects disclosed herein, to speed up performance of selected circuits in an IC that would otherwise lower the overall speed performance of the IC, a low-K dielectric material is employed during IC fabrication. The low-K dielectric material is provided in selected, localized areas of the ILD material in which the selected circuits are disposed during IC fabrication. For example, the use of low-K dielectric material in selected, localized areas of the ILD material may be performed during a backend-of-line (BEOL) process during fabrication. In one aspect, the areas of the ILD selected for use of low-K dielectric material in the IC contain circuit components and/or circuit element interconnects for a critical path(s) in the selected circuits. In this manner, the IC will experience an overall increased speed performance during operation, because the circuit components and/or circuit element interconnects of the selected circuit(s) that are disposed in the low-K ILD material will experience reduced signal delay (e.g., wire delay, resistance-capacitance (RC) delay) than would otherwise be experienced if low-K dielectric material were not employed. Also, by use of low-K dielectric material in only selected, localized areas of ILD material of the selected circuits in the IC to increase the speed performance of the selected circuits, mechanical and/or thermal stability concern issues that would arise from use of low-K dielectric material in all of the ILD material in the IC are avoided. Low-K dielectric material is known to have lower mechanical strength that can lead to damage in a semiconductor device due to the stress exerted on the ILD material during fabrication.

In this regard in one aspect, a multi-processor core central processing unit (CPU) is provided. The multi-processor core CPU comprises a substrate. The multi-processor core CPU also comprises a plurality of processor cores disposed above the substrate. Each processor core among the plurality of processor cores comprises a plurality of ILDs each comprised of a dielectric material. Each processor core among the plurality of processor cores also comprises a plurality of semiconductor elements disposed in at least one first ILD among the plurality of ILDs. Each processor core among the plurality of processor cores also comprises a plurality of circuit element interconnects disposed in at least one second ILD among the plurality of ILDs. A first region of at least one ILD among the plurality of ILDs in at least one first processor core among the plurality of processor cores comprises a first K dielectric material. A second region of the at least one ILD among the plurality of ILDs in at least one second processor core among the plurality of processor cores, different from the at least one first processor core, comprises a low-K dielectric material having a lower-K value than the first K dielectric material.

In another aspect, an IC is provided. The IC comprises a substrate. The IC also comprises a plurality of ILDs comprised of a dielectric material, the plurality of ILDs disposed above the substrate. The IC also comprises a plurality of circuits comprised of at least one critical path element and at least one non-critical path element Each of the plurality of circuits comprises a plurality of semiconductor elements disposed in at least one first ILD among the plurality of ILDs. Each of the plurality of circuits also comprises at least one circuit element interconnect disposed in at least one second ILD among the plurality of ILDs, the at least one circuit element interconnect conductively coupled to at least one semiconductor element among the plurality of semiconductor elements. A region of the plurality of ILDs in which the at least one non-critical path element is disposed comprises a first K dielectric material. At least a region of the plurality of ILDs in which the at least one critical path element is disposed comprises a second K dielectric material comprised of a low-K dielectric material having a lower-K value than the first K dielectric material.

In another aspect, an IC is provided. The IC comprises a means for providing a substrate. The IC also comprises a means for providing a plurality of ILDs comprised of a dielectric material. The means for providing the plurality of ILDs is disposed above the means for providing the substrate. The IC also comprises a plurality of circuit means comprised of at least one critical path means and at least one non-critical path means. Each of the plurality of circuit means comprises a plurality of semiconductor means disposed in at least one means for providing a first ILD among the means for providing the plurality of ILDs. Each of the plurality of circuit means also comprises at least one means for providing a circuit element interconnect disposed in at least one means for providing a second ILD among the means for providing the plurality of ILDs. The at least one means for providing the circuit element interconnect is conductively coupled to at least one semiconductor means among the plurality of semiconductor means. A region of the means for providing the plurality of ILDs in which the at least one non-critical path means is disposed comprises a first K dielectric material. At least a region of the means for providing the plurality of ILDs in which the at least one critical path means is disposed comprises a second K dielectric material comprised of a low-K dielectric material having a lower-K value than the first K dielectric material.

In another aspect, a method of fabricating an IC is provided. The method comprises providing a substrate. The method also comprises providing a plurality of ILDs each comprising a dielectric material disposed above the substrate. Providing the plurality of ILDs comprises providing at least one first ILD among the plurality of ILDs above the substrate. Providing the plurality of ILDs also comprises providing at least one second ILD among the plurality of ILDs above the substrate. Providing the plurality of ILDs also comprises providing a plurality of circuits comprised of at least one critical path element and at least one non-critical path element. Providing the plurality of ILDs further comprises providing a first K dielectric material in a region of the plurality of ILDs in which the at least one non-critical path element will be disposed. Providing the plurality of ILDs also further comprises providing a second K dielectric material comprised of a low-K dielectric material having a lower-K value than the first K dielectric material, in at least a region of the plurality of ILDs in which the at least one critical path element will be disposed. Providing the plurality of circuits further comprises disposing a plurality of semiconductor elements in the at least one first ILD. Providing the plurality of circuits also further comprises disposing at least one circuit element interconnect in the at least one second ILD among the plurality of ILDs.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the disclosure involve semiconductor integrated circuits (ICs) employing localized low dielectric constant (low-K) material in inter-layer dielectric (ILD) material for improved speed performance. Related devices, methods, memory systems are also disclosed. As a non-limiting example, the low-K material may have a K value lower than 3.5 or approximately 3.5. In certain aspects disclosed herein, to speed up performance of selected circuits in an IC that would otherwise lower the overall speed performance of the IC, a low-K dielectric material is employed during IC fabrication. The low-K dielectric material is provided in selected, localized areas of the ILD material in which the selected circuits are disposed during IC fabrication. For example, the use of low-K dielectric material in selected, localized areas of the ILD material may be performed during a backend-of-line (BEOL) process during fabrication. In one aspect, the areas of the ILD selected for use of low-K dielectric material in the IC contain circuit components and/or circuit element interconnects for a critical path(s) in the selected circuits. In this manner, the IC will experience an overall increased speed performance during operation, because the circuit components and/or circuit element interconnects of the selected circuit(s) that are disposed in the low-K ILD material will experience reduced signal delay (e.g., wire delay, resistance-capacitance (RC) delay) than would otherwise be experienced if low-K dielectric material were not employed. Also, by use of low-K dielectric material in only selected, localized areas of ILD material of the selected circuits in the IC to increase the speed performance of the selected circuits, mechanical and/or thermal stability concern issues that would arise from use of low-K dielectric material in all of the ILD material in the IC are avoided. Low-K dielectric material is known to have lower mechanical strength that can lead to damage in a semiconductor device due to the stress exerted on the ILD material during fabrication.

Figure 3A:
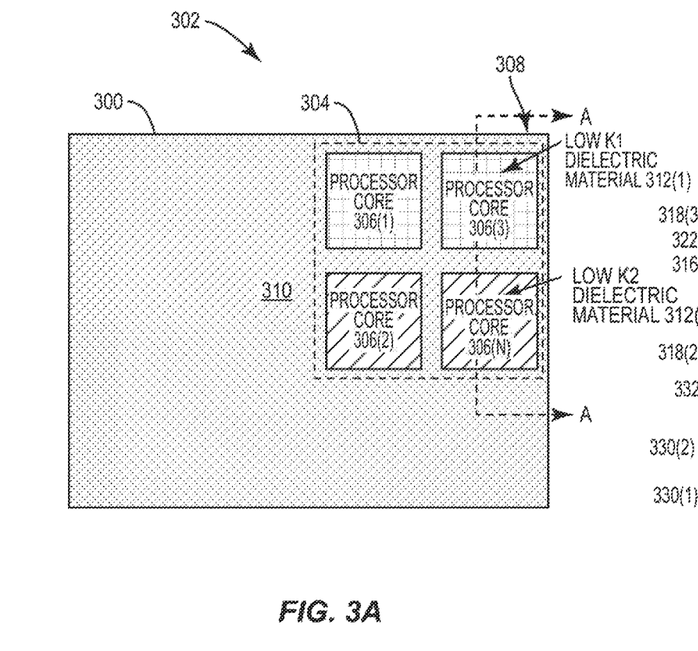
FIGS. 3A and 3B are top and side view block diagrams, respectively, of a SoC that includes a CPU comprised of multiple processor cores, wherein a low-K dielectric material is used in an inter-layer dielectric (ILD) material in localized areas of selected processor cores to compensate for process and other speed performance processor core variations.
Figure 3B:
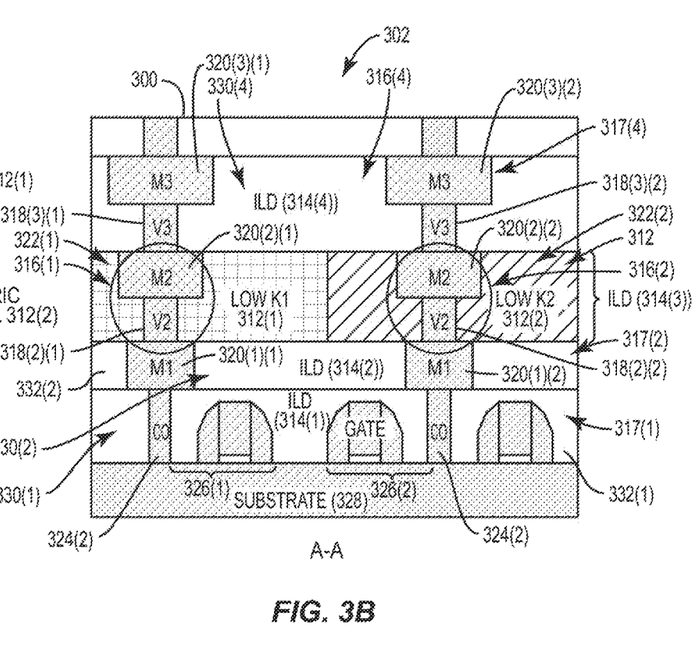

In this regard, FIGS. 3A and 3B are top and side view block diagrams, respectively, of an IC chip 300 ("chip 300") provided in the form of an SoC 302. As shown in FIG. 3A, the SoC 302 includes a CPU 304 comprised of multiple processor cores 306(1)-306(N). In this example, 'N' is four (4), meaning there are four (4) processor cores 306(1)-306(4). However, one or any number of processor cores 306 may be provided. If core-to-core variations exist in the processor cores 306(1)-306(4) in the CPU 304 of the SoC 302, the overall chip 300 speed will be limited by the slowest processor core 306 in the CPU 304. However, the overall chip 300 leakage current will be dominated by the faster processor cores 306(1)-306(N) in the CPU 304. Thus, if the speed performance of the faster processor cores 306(1)-306(N) in the CPU 304 is increased beyond the speed performance of the slower processor core 306, the leakage of the SoC 302 increases without an overall speed performance benefit of the SoC 302.

Different speed performances in the processor cores 306(1)-306(N) in the SoC 302 may exist for several reasons. For example, the processor cores 306(1)-306(N) in the SoC 302 in FIG. 3A being located in different locations on the chip 300 can affect their relative performance speeds. As shown in FIG. 3A, processor core 306(3) is located in a corner 308 of the chip 300. Processor cores 306(1), 306(N) are located near the corner 308 in the chip 300. Processor core 306(2) is located closer to a center 310 of the chip 300. Also, each processor core 306(1)-306(N) in the SoC 302 may be surrounded by different circuit blocks in the chip 300, which contribute differently to the thermal impact to each processor core 306(1)-306(4). Further, localized process variations during manufacturing of the SoC 302 could also vary threshold voltage levels (Vt) in the processor cores 306(1)-306(N) that cause variations in speed performance. Mechanical stress could also be different for each processor core 306(1)-306(N) due to location and device density.

In this regard, FIG. 3B is provided. FIG. 3B is a side view cut across the A-A line of the chip 300 in FIG. 3A. As shown in FIG. 3B, a low constant (low-K) dielectric material 312 is selectively provided in a select ILD 314 of a slower processor core(s) 306 in the CPU 304 to improve speed performance of the slower processor core(s) 306. As a non-limiting example, the low-K dielectric material 312 may have a K value lower than 3.5 or approximately 3.5. In this example, the slower processor cores in the CPU 304 are processor cores 306(3) and 306(N). Thus, an ILD 314 of the slower processor cores 306(3) and 306(N) is provided with a low-K dielectric material 312 during chip 300 fabrication. Providing a low-K dielectric material 312 in an ILD 314 of the slower processor core(s) 306 of the CPU 304 can compensate for process and other speed performance processor core 306(1)-306(N) variations so that overall speed performance of the SoC 302 can be increased. In this manner, the chip 300 will experience an overall increased speed performance during operation, because the circuit components and/or circuit element interconnects of the selected circuit(s) that are disposed in the low-K dielectric material will experience reduced signal delay (e.g., wire delay, resistance-capacitance (RC) delay) than would otherwise be experienced if low-K dielectric material were not employed.

In this example of the SoC 302 in FIG. 3B, four (4) ILDs 314(1)-314(4) are shown in the chip 300. Only ILD 314(3) is provided with the low-K dielectric material 312 during a backend-of-line (BEOL) process during chip 300 fabrication in this example. In this example, the low-K dielectric material 312 is selectively provided in the ILD 314(3), because the ILD 314(3) is deemed to have circuit components and/or circuit element interconnects that are in critical path elements 316(1), 316(2) in the processor cores 306(3), 306(N). The other ILDs 314(1)-314(2), 314(4) may only have non-critical path elements 317(1)-317(2), 317(4). Also, low-K dielectric material is known to have lower mechanical strength that can lead to damage in a semiconductor device due to the stress exerted on the ILD material during IC fabrication. Thus, by only selectively providing the low-K dielectric material 312 in an ILD(s) 314 in the chip 300, as opposed to all ILDs, mechanical stress exerted on the chip 300 and/or thermal stability issues can be reduced or avoided during fabrication, but yet the benefit of providing the low-K dielectric material 312 in selected ILD(s) 314 to increase speed performance of certain circuit components and/or circuit element interconnects is still obtained. Other ILDs, such as ILDs 314(1) and 314(3) in FIG. 3B are either provided with a low-K dielectric material 312, or with a low-K dielectric material 312 that does not have as low a K constant as the low-K dielectric material 312, such that the chip 300 is not damaged while under stress during fabrication. Providing circuit components and/or circuit element interconnects in the low-K dielectric material 312 can reduce wire delay and/or resistance-capacitance (RC) delay.

For example, in FIG. 3B, only the ILD 314(3) contains the low-K dielectric material 312. In this regard, vias 318(2)(1), 318(2)(2) interconnecting second metal layers 320(2)(1), 320(2)(2) are disposed in the low-K dielectric material 312 to reduce wire delay in these interconnecting elements. Via 318(2)(1) and second metal layer 320(2)(1) are disposed in a first low-K dielectric material 312(1) provided in a first region 322(1) of the ILD 314(3). Via 318(2)(2) and second metal layer 320(2)(2) are disposed in a second low-K dielectric material 312(2) provided in a second region 322 (2) of the ILD 314(3). The vias 318(2)(1), 318(2)(2) provide interconnectivity to respective first metal layers 320(1)(1), 320(1)(2) that provide interconnectivity to circuit electrodes 324(1), 324(2) of semiconductor elements 326(1), 326(2) disposed on a substrate 328. Thus, the overall wire delay of the interconnection to the semiconductor elements 326(1), 326(2) will be reduced because of the reduction in wire delay in the respective vias 318(2)(1), 318(2)(2) and respective second metal layers 320(2)(1), 320(2)(2) that are part of the connectivity path to the semiconductor elements 326(1), 326(2). The other ILDs 314(1)-314(2), and 314(4) in this example of the chip 300, or at least respective regions 330(1)-330(2), 330(4) of these ILDs 314(1)-314(2), 314(4), contain a K dielectric material 332(1)-332(2), 332(4) that is either not a low-K dielectric material 312 or only a region or portion of those ILDs 314(1)-314(2), and 314(4) would contain a low-K dielectric material 312.

With continuing reference to FIG. 3B, the K value of the first low-K dielectric material 312(1) and the second low-K dielectric material 312(2) can be selected based on the desired reduction in wire delay of the respective vias 318 (2)(1), 318(2)(2) and second metal layers 320(2)(1), 320(2) (2). The first low-K dielectric material 312(1) and the second low-K dielectric material 312(2) can be provided having the same K constant, which may be 3.5, approximately 3.5 or less as a non-limiting example. Alternatively, the first low-K dielectric material 312(1) and the second low-K dielectric material 312(2) can be provided having different K constants.

Further, with continuing reference to FIG. 3B, either of the low-K dielectric materials 312(1), 312(2) could be comprised of porous low-K dielectric material. Alternatively, the either of the low-K dielectric materials 312(1), 312(2) could be comprised of an air gap to provide a dielectric layer or area in the ILD 314(3). The low-K dielectric materials 312(1), 312(2) could be a doped low-K dielectric material, such as carbon-doped low-K dielectric material or flourene-doped low-K dielectric material, as non-limiting examples. The low-K dielectric materials 312 (1), 312(2) could also be a low-K polymeric dielectric material.

Figure 4:
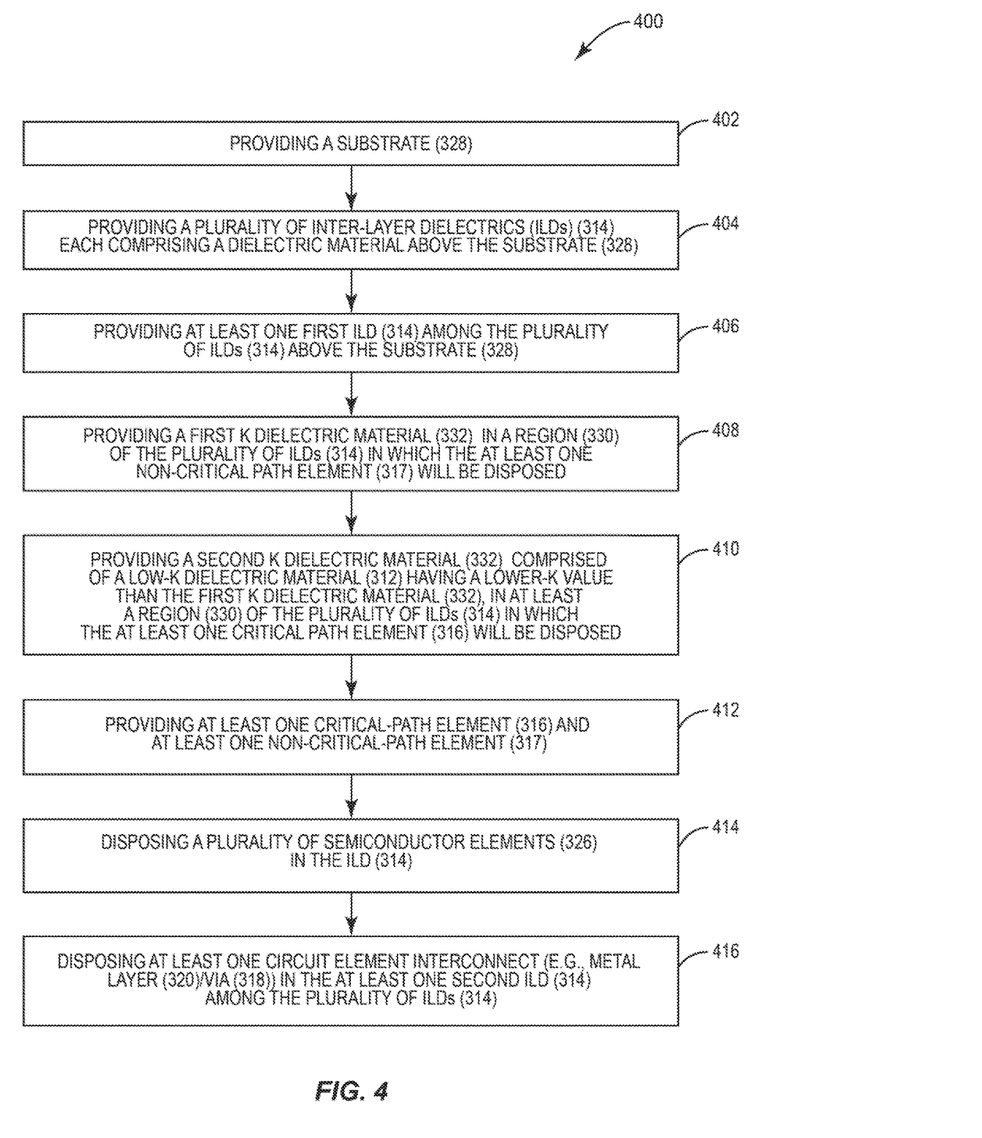
FIG. 4 is a flowchart illustrating an exemplary process of providing a low-K dielectric material in an ILD material in a localized area(s) of the selected processor cores in FIGS. 3A and 3B to compensate for process and other speed performance processor core variations.

To provide for the low-K dielectric materials 312(1), 312(2) in the ILD 314(3) in the chip 300 in FIGS. 3A and 3B, the low-K dielectric materials 312(1), 312(2) in the ILD 314(3) are disposed in the chip 300 during a fabrication process. In this example, the low-K dielectric materials 312(1), 312(2) would be provided to provide the ILD 314(3) after the ILD 314(2) is fabricated. The low-K dielectric materials 312(1), 312(2) would be disposed on top of the ILD 314(2). In this regard, FIG. 4 is a flowchart illustrating an exemplary fabrication process 400 that involves providing a low-K dielectric material in an ILD, such as ILD 314(3) in the chip 300 in FIGS. 3A and 3B, in a localized area(s) of the selected processor cores 306, such as processor cores 306(3), 306(N) to compensate for process and other speed performance processor core 306 variations. The fabrication process 400 in FIG. 4 will be discussed with reference to the SoC 302 in FIGS. 3A and 3B as a non-limiting example.

In this regard, with reference to FIG. 4, the fabrication process 400 begins with the substrate 328 being provided (block 402). Next, the plurality of ILDs 314(1)-314(4) are disposed above the substrate 328, wherein each of the plurality of ILDs 314(1)-314(4) comprises a dielectric material (block 404). Circuit components, such as the semiconductor elements 326(1), 326(2), can be disposed in an ILD 314, which in the example of FIG. 3B is ILD 314(1) directly above the substrate 328. Or, circuit and/or circuit element interconnects, such as the vias 318(1)-318(4) and metal layers 320(1)-320(4) may be disposed in respective ILDs 314(1)-314(4) as part of the fabrication of the chip 300 according to this circuit and layout design. This process involves providing at least one first ILD 314(1) among the plurality of ILDs 314 above the substrate 328 (block 406). For example, with regard to the SoC 302 in FIG. 3B, a first K dielectric material 332(1) is provided in the first region 330(1) of the ILD 314(1) or the entire ILD 314(1) in which at least one non-critical path element 317 will be disposed (block 408). In the example of FIG. 3B, the non-critical path elements 317 are the circuit electrodes 324(1), 324(2) of semiconductor elements 326(1), 326(2). Also, in the example of the SoC 302 in FIG. 3B, the ILD 314(1) also does not contain any critical path elements, and thus is fabricated from a first K dielectric material 332(2) provided in the region 330(2) of the ILD 314(2).

With continuing reference to FIG. 4, if an ILD 314 were to also have a critical path element 316 in addition to a non-critical path element 317, a second K dielectric material comprised of the low-K dielectric material 312 having a lower-K value than the first K dielectric material 332 could be also provided in the ILD 314 or region 330 in which the critical path element 316 would be disposed (block 410). This step could be provided in a particular ILD 314 that has both non-critical path elements 317, and critical path elements 316 desired to be disposed in a low-K dielectric material 312 in the ILD 314. This step is not provided in the SoC 302 in FIG. 3B, because no ILDs 314 are provided that have both low-K dielectric material 312 and K dielectric material 332 that is not low-K dielectric material. In the example of the SoC 302 in FIG. 3B, a second K dielectric material comprised of the low-K dielectric material 312 having a lower-K value than the first K dielectric material 332 is provided in a separate ILD 314(3) from the ILDs 314(1)-314(2), 314(4), as previously discussed above (block 410). In this example, ILD 314(3) would be fabricated after ILDs 314(1) and 314(2) and the elements disposed therein fabricated first above the substrate 328. Using the SoC 302 in FIG. 3B as a non-limiting example, note that the low-K dielectric material 312 could be spun onto in liquid form to an underlying ILD 314(2) to provide the low-K dielectric material 312 in the fabricated ILD 314(3).

With continuing reference to FIG. 4, as each ILD 314 is being formed, critical path elements 316 that are desired to be speed performance increased and/or non-critical path elements 317 are disposed in the ILD 314 (block 412). As discussed above, if the elements to be disposed in a particular ILD 314 are semiconductor elements 326, the semiconductor elements 326 are disposed in the ILD 314 (block 414). If the elements to be disposed in a particular ILD 314 involve circuit element interconnects, such as via(s) 318 and metal layer(s) 320, these elements are disposed in the ILD 314 during fabrication (block 416). In the example of the SoC 302 in FIG. 3B, the vias 318(2)(1), 318(2)(2) and respective metal layer(s) 320(2)(1), 320(2)(2) disposed in ILD 314(3) were deemed critical path elements 316(3) that are disposed in the respective low-K dielectric materials 312(1), 312(2) to reduce wire delay of the vias 318(2)(1), 318(2)(2) and respective metal layer(s) 320(2)(1), 320(2)(2).

Figure 5A:
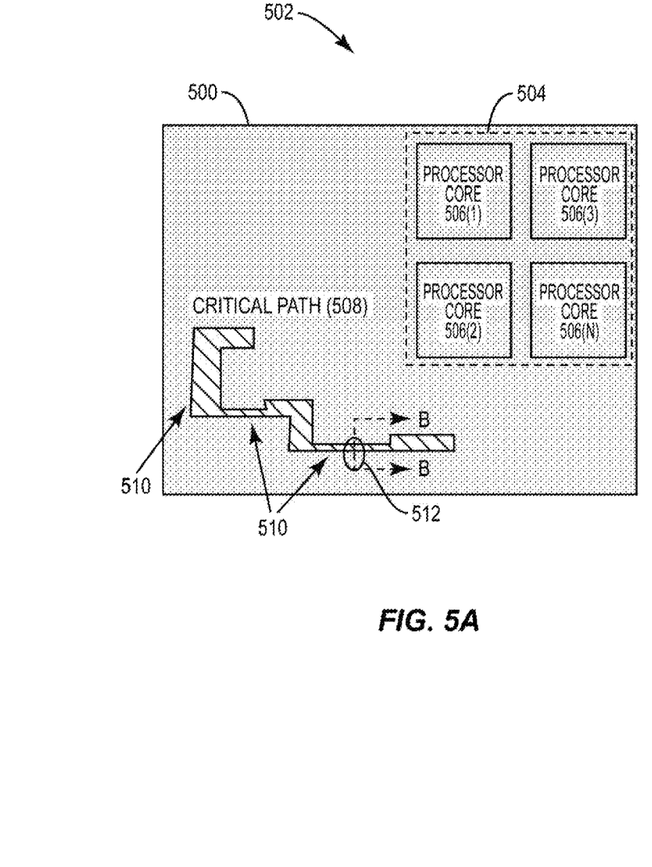
FIGS. 5A and 5B are top and side view block diagrams, respectively, of an integrated circuit (IC), wherein a low-K dielectric material is used in an ILD material in localized areas of a selected critical path to compensate for process and other speed performance variations.
Figure 5B:
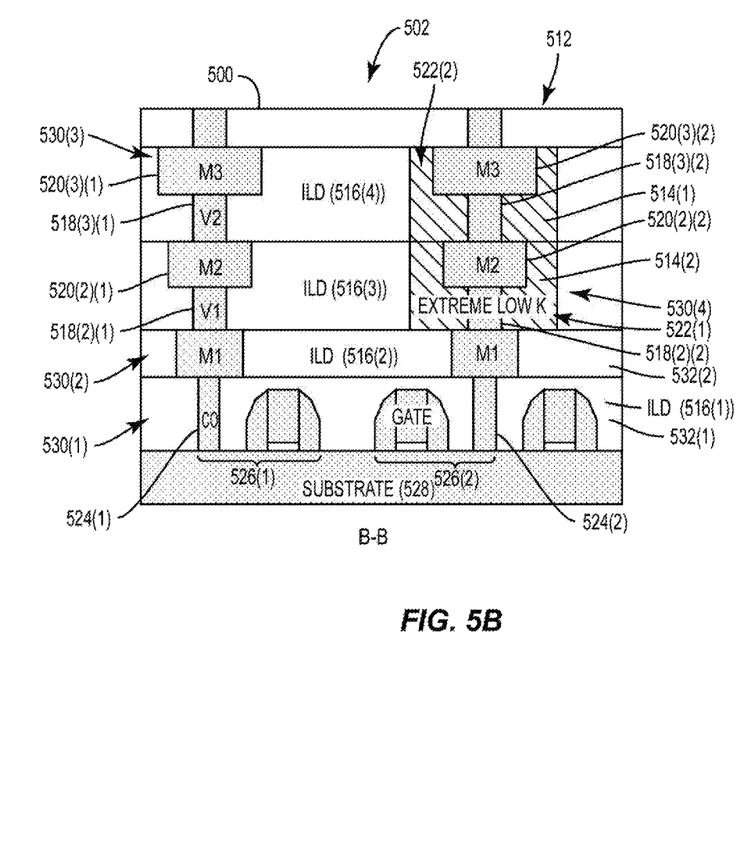

A low-K dielectric material can also be selectively provided in a select ILD 314 of a circuit or circuit path of the SoC 302 in FIGS. 3A and 3B that is not part of the CPU 304. For example, there may be circuit path components that negatively affect the overall speed performance of the SoC 302. In this regard, FIGS. 5A and 5B are top and side view block diagrams, respectively, of an IC chip 500 ("chip 500") provided in the form of an SoC 502 similar to the SoC 302 in FIGS. 3A and 3B. As shown in FIG. 5A, the SoC 502 includes a CPU 504 comprised of multiple processor cores 506(1)-506(N) similar to the CPU 304 in the SoC 302 in FIG. 3A. If circuit variations exist in critical paths in the chip 500, the overall chip 500 speed may be limited by the slowest critical path in the chip 500. For example, FIG. 5A illustrates such a critical path 508 that may span different circuits 510 in the chip 500. However, the overall chip 500 leakage current may be dominated by the faster critical paths (not shown) in the chip 500. Thus, if the speed performance of the faster critical paths in the chip 500 is increased beyond the speed performance of the slower critical path 508, the leakage of the SoC 502 increases without an overall speed performance benefit of the SoC 502.

In this regard, FIG. 5B is provided. FIG. 5B is a side view cut across the B-B line of the critical path 508 in the chip 500 illustrated in FIG. 5A to show a portion 512 of the critical path 508. As shown in FIG. 5B, a low constant (low-K) dielectric material 514(1), 514(2) is selectively provided in respective select ILDs 516(3), 516(4) of the portion 512 of the critical path 508 in the chip 500 during fabrication to improve speed performance of the slower critical path 508. As a non-limiting example, the low-K dielectric materials 514(1), 514(2) may individually or both have a K value lower than 3.5 or approximately 3.5. Providing the low-K dielectric material 514 in the ILDs 516(3), 516(4) of the slower critical path 508 in the chip 500 can compensate for process and other speed performance variations between the circuits 510 in the critical path 508 and other critical paths in the chip 500 so that overall speed performance of the SoC 502 can be increased. In this manner, the chip 500 will experience an overall increased speed performance during operation, because the circuit components and/or circuit element interconnects of the selected circuit(s) 510 that are disposed in the low-K dielectric material 514 will experience reduced signal delay (e.g., wire delay, resistance-capacitance (RC) delay) than would otherwise be experienced if the low-K dielectric material 514 were not employed.

In this example of the SoC 502 in FIG. 5B, four (4) ILDs 516(1)-516(4) are shown for the portion 512 of the critical path 508 in the chip 500. Only ILDs 516(3), 516(4) are provided with the low-K dielectric materials 514(1), 514(2) during a backend-of-line (BEOL) process during chip 500 fabrication in this example. In this example, the low-K dielectric material 514(1), 514(2) is selectively provided in the ILDs 516(3), 516(4), because ILDs 516(3), 516(4) are deemed to have circuit components and/or circuit element interconnects that need to be speed performance improved for the critical path 508 in the chip 500. The other ILDs 516(1), 516(2) may have circuit elements that do not require increased speed performance to increase the overall speed performance of the critical path 508 to the desired speed performance level. In this regard, the other ILDs 516(1), 516(2) in FIG. 5B are either provided with a low-K dielectric material 514, or with a low-K dielectric material 514 that does not have as low a K constant as the low-K dielectric material 514(1), 514(2) such that the chip 500 is not damaged while under stress during fabrication. Providing circuit components and/or circuit element interconnects in a low-K dielectric material 514 can reduce wire delay and/or resistance-capacitance (RC) delay.

For example, in FIG. 5B, ILD 516(3) contains the low-K dielectric material 514(1). ILD 516(4) contains the low-K dielectric material 514(2). In this regard, a via 518(2)(2) interconnecting second metal layer 520(2)(2) is disposed in the low-K dielectric material 514(1) to reduce wire delay in these interconnecting elements. Via 518(2)(2) and second metal layer 520(2)(2) are disposed in a first low-K dielectric material 514(2) provided in a first region 522(1) of the ILD 516(3). Similarly, a via 518(3)(2) interconnecting a third metal layer 520(3)(2) is disposed in the low-K dielectric material 514(2) to reduce wire delay in these interconnecting elements. Via 518(3)(2) and third metal layer 520(3)(2) are disposed in the second low-K dielectric material 514(2) provided in a second region 522(2) of the ILD 516(4). The vias 518(2)(1), 518(2)(2) provide interconnectivity to respective first metal layers 520(1)(1), 520(1)(2) that provide interconnectivity to circuit electrodes 524(1), 524(2) of semiconductor elements 526(1), 526(2) disposed on a substrate 528. The vias 518(3)(1), 518(3)(2) provide interconnectivity to respective second metal layers 520(2)(1), 520(2)(2) that provide interconnectivity to the first metal layers 520(1)(1), 520(1)(2) and circuit electrodes 524(1), 524(2) of the semiconductor elements 526(1), 526(2). Thus, the overall wire delay of the interconnection to semiconductor element 526(2) will be reduced, because of the reduction in wire delay in the respective vias 518(2)(2), 518(3)(2) and respective second and third metal layers 520(2)(2), 520(3)(2) that are part of the connectivity path to the semiconductor element 526(2). The other ILDs 516(1), 516(2) in this example of the chip 500, or at least respective regions 530(1), 530(2) of these ILDs 516(1), 516(2) contain a K dielectric material 532(1), 532(2) that is either not a low-K dielectric material or only a region or portion of those ILDs 516(1), 516(2) would contain a low-K dielectric material.

With continuing reference to FIG. 5B, the K value of the first low-K dielectric material 514(1) and the second low-K dielectric material 514(2) can be selected based on the desired reduction in wire delay of the respective vias 518(2)(2), 518(3)(2) and second and third metal layers 520(2)(2), 520(3)(2). The first low-K dielectric material 514(1) and the second low-K dielectric material 514(2) can be provided having the same K constant. Alternatively, the first low-K dielectric material 514(1) and the second low-K dielectric material 514(2) can be provided having different K constants.

Further, with continuing reference to FIG. 5B, either of the low-K dielectric materials 514(1), 514(2) could be comprised of porous low-K dielectric material. Alternatively, the either of the low-K dielectric materials 514(1), 514(2) could be comprised of an air gap to provide a dielectric layer or area in the ILDs 516(3), 516(4). The low-K dielectric materials 514(1), 514(2) could be a doped low-K dielectric material, such as carbon-doped low-K dielectric material or flourene-doped low-K dielectric material, as non-limiting examples. The low-K dielectric materials 514(1), 514(2) could also be a low-K polymeric dielectric material.

It is also possible that a combination of one or more critical paths and/or processor cores in a SoC could employ selective use of a low-K dielectric material in a select ILD to increase the performance speed of certain circuit components and/or paths in the SoC. This may be desired if there are both one or more processor cores and one or more critical paths in an SoC that are desired to be increased in speed performance in the SoC with select use of low-K dielectric material in their ILD(s). In this regard, note that an SoC could be fabricated that includes a combination of the fabrication techniques employed in FIG. 3B for a processor core(s) in a CPU and in FIG. 5B for one or more critical paths in an SoC. In this regard, the selective use of one or more low-K dielectric materials can be provided during fabrication of one or more processor cores similar to that provided in the fabricated SoC 302 in FIG. 3B, but also provide selective use of one or more low-K dielectric materials in one or more critical paths in the fabricated SoC, similar to that provided in the SoC 502 in FIG. 5B. These combinations or any other combinations or permutations of the above described examples of an SoC are within the scope of this disclosure.

The semiconductor ICs and SoC's employing localized low-K dielectric material in ILD material for improved speed performance of selected circuits according to aspects disclosed herein, may be provided in or integrated into any integrated circuit or processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
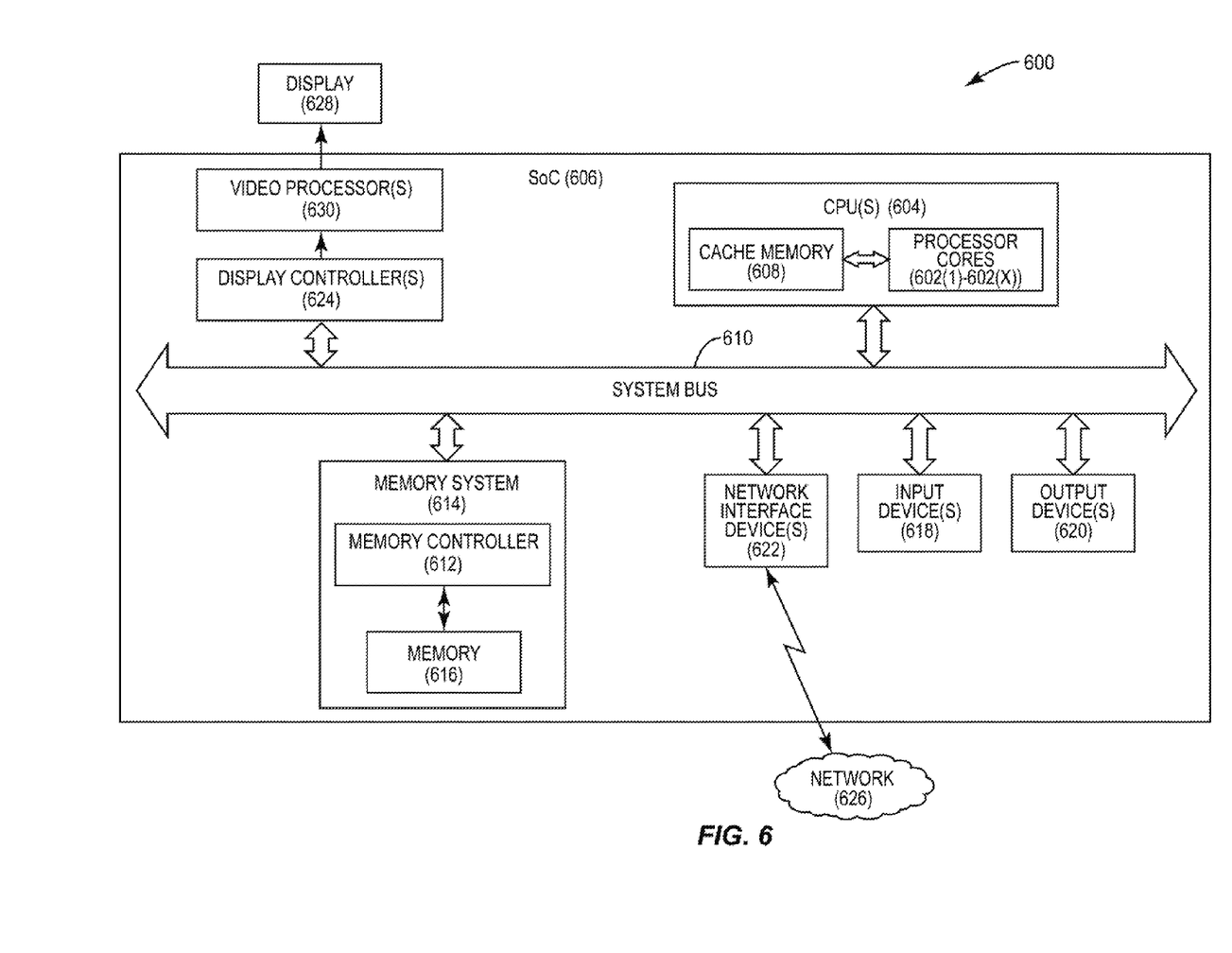
FIG. 6 is a block diagram of an exemplary processor-based system in a SoC that includes a CPU comprised of multiple processor cores, wherein a low-K dielectric material is used in an ILD material in localized areas of a selected processor core(s) to compensate for process and other speed performance processor core variations.

In this regard, FIG. 6 illustrates an example of a processor-based system 600 that includes multiple processor cores 602(1)-602(X) in a CPU 604 in a SoC 606, where 'X' represents the number of processor cores 602 provided in the CPU 604. One or more of the processor cores 602(1)-602(X) are determined to be slower speed performance processor cores than other processor cores 602(1)-602(X) if the SoC 606 were fabricated due to process and/or other environmental variations in the SoC 606. In this regard, during fabrication of the SoC 606, the processor cores 602(1)-602(X) that were determined to be slower speed performance processor cores than other processor cores 602(1)-602(X), if the SoC 606 were fabricated, are selected to be fabricated to include localized low-K dielectric material in their ILD material. In this manner, the speed performance of the selected processor cores 602(1)-602(X) is increased to avoid limiting the overall speed performance of the SoC 606.

With continuing reference to FIG. 6, the CPU 604 may have cache memory 608 coupled to the processor cores 602(1)-602(X) for rapid access to temporarily stored data. The CPU 604 is coupled to a system bus 610 and can intercouple master and slave devices included in the processor-based system 600. As is well known, the CPU 604 communicates with these other devices by exchanging address, control, and data information over the system bus 610. For example, the CPU 604 can communicate bus transaction requests to a memory controller 612 in a memory system 614 as an example of a slave device. Although not illustrated in FIG. 6, multiple system buses 610 could be provided, wherein each system bus 610 constitutes a different fabric. In this example, the memory controller 612 is configured to provide memory access requests to memory 616 in the memory system 614.

Other devices can be connected to the system bus 610. As illustrated in FIG. 6, these devices can include the memory system 614, one or more input devices 618, one or more output devices 620, one or more network interface devices 622, and one or more display controllers 624, as examples. The input device(s) 618 can include any type of input device, including but not limited to input keys, switches, voice processors, etc. The output device(s) 620 can include any type of output device, including but not limited to audio, video, other visual indicators, etc. The network interface device(s) 622 can be any devices configured to allow exchange of data to and from a network 626. The network 626 can be any type of network, including but not limited to a wired or wireless network, a private or public network, a local area network (LAN), a wide local area network (WLAN), and the Internet. The network interface device(s) 622 can be configured to support any type of communications protocol desired.

The CPU 604 may also be configured to access the display controller(s) 624 over the system bus 610 to control information sent to one or more displays 628 off-chip of the SoC 606. The display controller(s) 624 sends information to the display(s) 628 to be displayed via one or more video processors 630, which process the information to be displayed into a format suitable for the display(s) 628. The display(s) 628 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multi-processor core central processing unit (CPU), comprising:
   a substrate;
   a plurality of processor cores disposed above the substrate;
   each processor core among the plurality of processor cores, comprising:
      a plurality of inter-layer dielectrics (ILDs) each comprised of a dielectric material;
      a plurality of semiconductor elements disposed in at least one first ILD among the plurality of ILDs; and
      a plurality of circuit element interconnects disposed in at least one second ILD among the plurality of ILDs;
   wherein a first region of at least one ILD among the plurality of ILDs in at least one first processor core among the plurality of processor cores comprises a first K dielectric material; and
   wherein a second region of the at least one ILD among the plurality of ILDs in at least one second processor core among the plurality of processor cores, different from the at least one first processor core, comprises a low-K dielectric material having a lower-K value than the first K dielectric material.

2. The multi-processor core CPU of claim 1, wherein the low-K dielectric material is comprised of the dielectric material having a K value lower than 3.5.

3. The multi-processor core CPU of claim 1, wherein the low-K dielectric material is comprised of a porous low-K dielectric material.

4. The multi-processor core CPU of claim 1, wherein the low-K dielectric material is comprised of an air gap.

5. The multi-processor core CPU of claim 1, wherein the low-K dielectric material is comprised of a doped low-K dielectric material.

6. The multi-processor core CPU of claim 5, wherein the doped low-K dielectric material is comprised from the group consisting of: a carbon-doped low-K dielectric material and a flourene-doped low-K dielectric material.

7. The multi-processor core CPU of claim 1, wherein the low-K dielectric material is comprised of a low-K polymeric dielectric material.

8. The multi-processor core CPU of claim 1, wherein at least a region of the plurality of ILDs that comprises a lower-K dielectric material comprises only one or more ILDs that only contain at least one circuit element interconnect.

9. The multi-processor core CPU of claim 1, wherein the first K dielectric material is not a low-K dielectric material.

10. The multi-processor core CPU of claim 1, wherein the first K dielectric material is comprised of a low-K dielectric material.

11. The multi-processor core CPU of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

12. The multi-processor core CPU of claim 1 integrated into a system-on-a-chip (SoC).

* * * * *